United States Patent
Yamano et al.

(10) Patent No.: US 7,955,454 B2
(45) Date of Patent: Jun. 7, 2011

(54) METHOD FOR FORMING WIRING ON INSULATING RESIN LAYER

(75) Inventors: Takaharu Yamano, Nagano (JP); Kosaku Harayama, Nagano (JP); Hiroyuki Kato, Nagano (JP); Tetsuya Koyama, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 359 days.

(21) Appl. No.: 11/516,737

(22) Filed: Sep. 7, 2006

(65) Prior Publication Data
US 2007/0051459 A1 Mar. 8, 2007

(30) Foreign Application Priority Data
Sep. 8, 2005 (JP) ................ P.2005-260844

(51) Int. Cl.
B29C 65/00 (2006.01)
A41G 1/00 (2006.01)
B32B 37/00 (2006.01)
C23F 3/00 (2006.01)

(52) U.S. Cl. ............ 156/60; 156/61; 156/253; 156/272; 216/75; 216/78

(58) Field of Classification Search ............ 156/61, 156/60, 253, 272; 216/75, 78, 100
See application file for complete search history.

(56) References Cited

U.S. PATENT DOCUMENTS
3,846,166 A * 11/1974 Atsushi et al. ............. 438/656
6,197,425 B1 * 3/2001 Sekimoto et al. ........... 428/416
2004/0231141 A1 * 11/2004 Nishinaka et al. ........... 29/609

FOREIGN PATENT DOCUMENTS
JP 2000-036662 A 2/2000
JP 2001-119125 A 4/2001
JP 2003-304068 10/2003
JP 2004055618 A * 2/2004

* cited by examiner

Primary Examiner — Tu B Hoang
Assistant Examiner — Ayub Maye
(74) Attorney, Agent, or Firm — Drinker Biddle & Reath LLP

(57) ABSTRACT

The method for forming wiring includes: laminating a thermosetting resin film and a metallic foil on an insulating substrate where base-layer wiring is formed, a mat surface of the metallic foil facing the resin film, pressing the film and the foil with application of heat; forming an opening in the metallic foil to expose a part of the insulating resin layer in which a via hole is to be formed; forming the via hole in the insulating resin layer by using as a mask the metallic foil; performing a desmear process of the via hole via the opening of the metallic foil; removing the metallic foil; forming an electroless-plated layer that covers the top surface of the insulating resin layer, a side surface of the via hole and a top surface of the base-layer wiring; and forming wiring including an electroplated layer on the electroless-plated layer.

2 Claims, 2 Drawing Sheets

METHOD FOR FORMING WIRING ON INSULATING RESIN LAYER

This application claims foreign priority based on Japanese Patent application No. 2005-260844, filed Sep. 8, 2005, the content of which is incorporated herein by reference in its entirety.

BACKGROUND OF THE INVENTION

1. Field of the Invention

The present invention relates to a method for forming wiring on an insulating resin layer to constitute an inter-layer insulating layer of a multi-layer printed wiring board.

2. Description of the Related Art

Manufacture of a multi-layer printed wiring board constituting a printed wiring board, a semiconductor package (build-up board, package), a thin-component built-in board, a package-on-package (POP), etc., requires formation of wiring on an insulating resin layer serving as an inter-layer insulating layer.

As a representative example, in a case where a wiring layer made up of a metal such as Cu is formed on an insulating resin layer by electroplating in the manufacture of a build-up package, etc., a desmear process is generally performed for roughening the surface layer of a build-up resin by immersing it in a permanganic acid aqueous solution. The desmear process is originally made to remove machining scraps (smear) inside a via hole formed by laser machining, etc. Since the desmear process has a strong fluxing action on a resin, this process is applied for roughening the surface of a resin. When a wiring layer including an electroless-plated Cu layer (seed layer) and an electroplated Cu layer formed by a semi-additive process is formed on the roughened surface of the resin, unevenness of the roughened surface of the resin exhibits an anchor effect thus ensuring joining strength between the resin and the wiring.

However, in recent years, in semiconductor packages, etc., that use a multi-layer printed wiring board, in order to improve some characteristics, silica content of an insulating resin is increased so as to decrease thermal expansion coefficient. The increase of the silica content causes a drop in the desmear property of the resin, which makes it difficult to roughen the resin surface, resulting in insufficient joining strength between a resin and wiring.

Similarly, a prepreg material formed by impregnating a resin with a glass cloth is hard. Thus, it is difficult to roughen the prepreg material by the desmear process, and it is not possible to ensure joining strength with the wiring formed using the semi-additive process. Thus, a wiring formation by a subtractive method using a copper-foil-attached prepreg is mainly used.

Wiring formation by the subtractive method is not suited for finer design, and has limitations to finer design of the next generation.

On the other hand, a method has been practiced in the related art for roughening the resin surface not by using the desmear process, and ensuring joining strength between a resin and wiring in wiring formation by the semi-additive process (for example, refer to JP-A-2003-304068, in "Back Ground of the Invention", especially paragraph [0007]). This related art method will be described referring to FIG. 1. For convenience, the method is described just for one surface of a board, however, processing may be performed on both surfaces of a board in parallel.

As shown in FIG. 1-(1), a glass-epoxy resin substrate 10 is provided, a base-layer wiring layer 14 made up of a copper foil being formed via an insulating resin layer 12 on the surface of the glass-epoxy resin substrate 10.

Next, as shown in FIG. 1-(2), a thermosetting resin film 16 in a semi-cured state and a copper foil 18 are laid one over the other and pressed with heat (hot press) on the substrate 10. On that occasion, a mat surface (roughened surface) of the copper foil 18 is overlaid on the surface of the semi-cured resin film 16. To the top surface of the resin film 16 in semi-cured state against which the mat surface of the copper foil 18 is pressed is transferred the unevenness of the mat surface to form a roughened surface R. Thus, an integral structure is obtained where a substrate 10 including an insulating resin layer 12 and base-layer wiring 14, an insulating resin layer 16 made up of a thermally cured resin film, and a copper foil 18 are laminated.

Next, as shown in FIG. 1-(3), the copper foil 18 is removed by etching. This exposes the roughened surface R of the insulating resin layer 16. The roughened surface R generally has the roughness Ra of the mat surface of the copper foil being equal to about 2.0 to 4.0 micrometers. The mat surface exhibits a mechanical anchor effect between the mat surface and the wiring layer formed by plating on the copper foil so as to ensure a high joining strength.

As shown in FIG. 1-(4), a via hole 20 is made in a predetermined part of the insulating resin 16 by laser beam machining, etc.

Next, as shown in FIG. 1-(5), smear in the via hole 20 is removed by a desmear process. The unevenness of the roughened surface R is smoothed by the desmear process to form a less roughened surface R' rather than that the top surface of the insulating resin layer 16 is roughened by the desmear process.

Next, as shown in FIG. 1-(6), an electroless-plated copper layer 22 as a continuous layer is formed on the entirety of the exposed surface above the substrate 10, the exposed surface including the top surface [less roughened surface] R' of the insulating resin layer 16, side surface of the via hole 20 and the top surface of the base-layer wiring layer 14 being exposed at the bottom of the via hole 20.

Next, as shown in FIG. 1-(7), the electroless-plated copper layer 22 is used as a power feeding layer to form wiring 24 made up of an electroplated copper layer by a semi-additive process.

The wiring 24 thus obtained has a smaller mechanical anchor effect compared with the original roughened surface R because an interface between the wiring 24 and the insulating resin layer 16 as a ground layer is a less roughened surface R'. Thus, a large anchor effect that should have been obtained by the transfer of the unevenness of the copper foil mat surface can not be obtained, resulting in an insufficient joining strength between the resin and the wiring.

SUMMARY OF THE INVENTION

The present invention has been made in view of the above circumstances, and provides a method for forming wiring that ensures a sufficient joining strength to an insulating resin layer as a ground layer.

In some implementations, a method of the invention for forming wiring on an insulating resin layer comprising:

laminating a thermosetting resin film in a semi-cured state and a metallic foil in this order on an insulating substrate on which base-layer wiring is formed, a mat surface of the metallic foil facing the thermosetting resin film, and pressing the thermosetting resin film and the metallic foil with application of heat so as to form a single-piece structure in which the insulating resin layer including the thermosetting resin film in a cured state and the metallic foil are laminated on the insulating substrate;

forming an opening in the metallic foil so as to expose a part of the insulating resin layer in which a via hole is to be formed;

forming the via hole in the insulating resin layer by irradiating a beam onto insulating resin layer by using as a mask the metallic foil in which the opening is formed;

performing a desmear process of the via hole via the opening of the metallic foil;

removing the metallic foil by etching so as to expose a top surface of the insulating resin layer;

forming an electroless-plated layer that continuously covers the top surface of the insulating resin layer, a side surface of the via hole and a top surface of the base-layer wiring corresponding to the bottom of the via hole; and forming wiring including an electroplated layer on the electroless-plated layer by a semi-additive process.

According to the invention, the top surface of the thermosetting film in semi-cured state is roughened by transfer of the unevenness of the mat surface. At the time point when the desmear process is performed on the via hole in the insulating resin layer, the metallic foil sheathes to protect the top surface of the insulating resin layer except the via hole. After the desmear process is complete, the metallic foil is removed. Thus, the top surface of the insulating resin layer is a roughened surface that directly maintains the unevenness transferred from the mat surface of the metallic foil. As a result, a large mechanical anchor effect is obtained on the interface between the wiring formed on the roughened surface by plating and the insulating resin layer, thereby ensuring a high joining strength.

DESCRIPTION OF THE PREFERRED EMBODIMENTS

Figure 1:
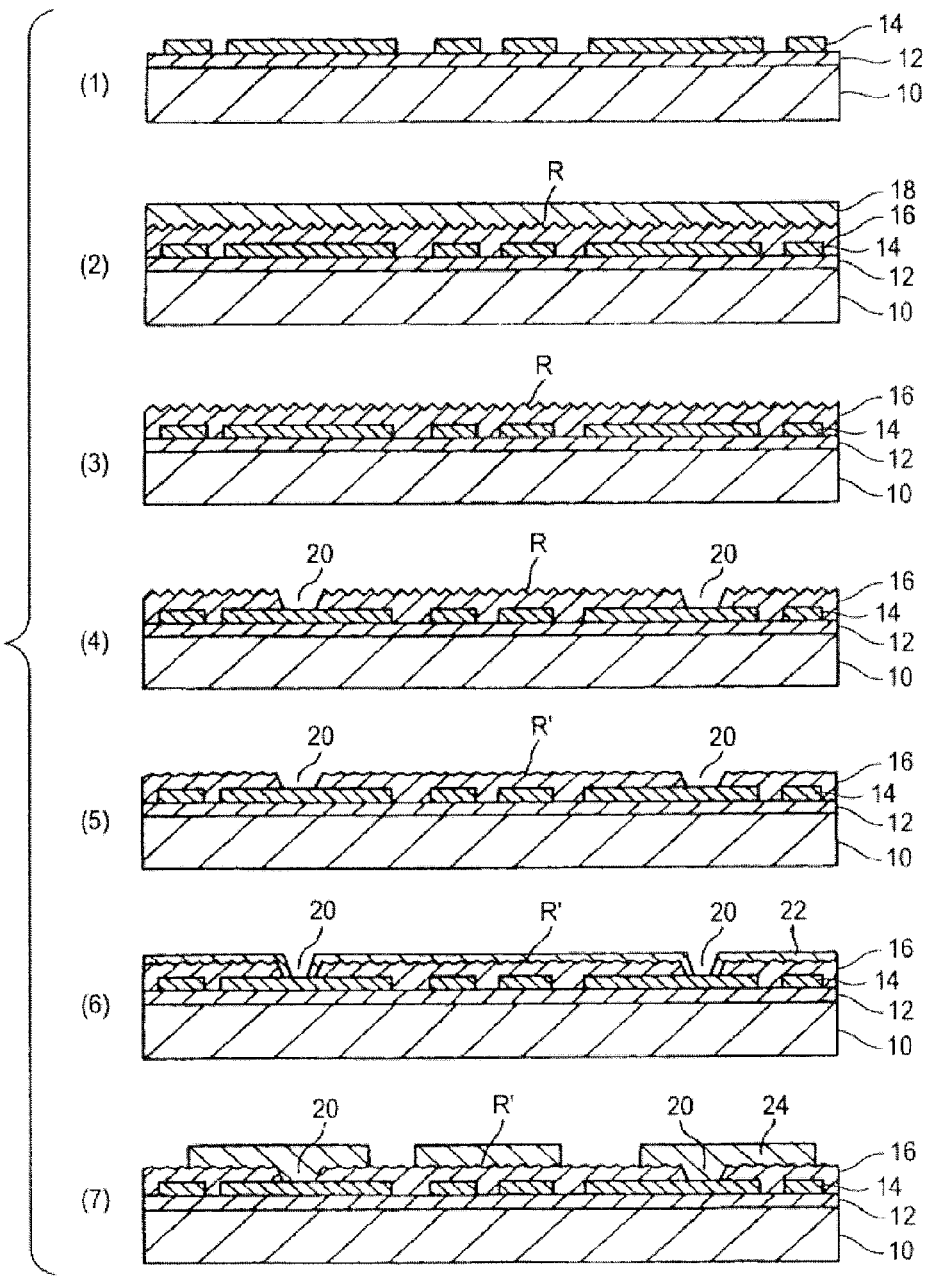
FIG. 1 is a cross-sectional view showing a process for forming wiring on an insulating resin layer by the related art method.
Figure 2:
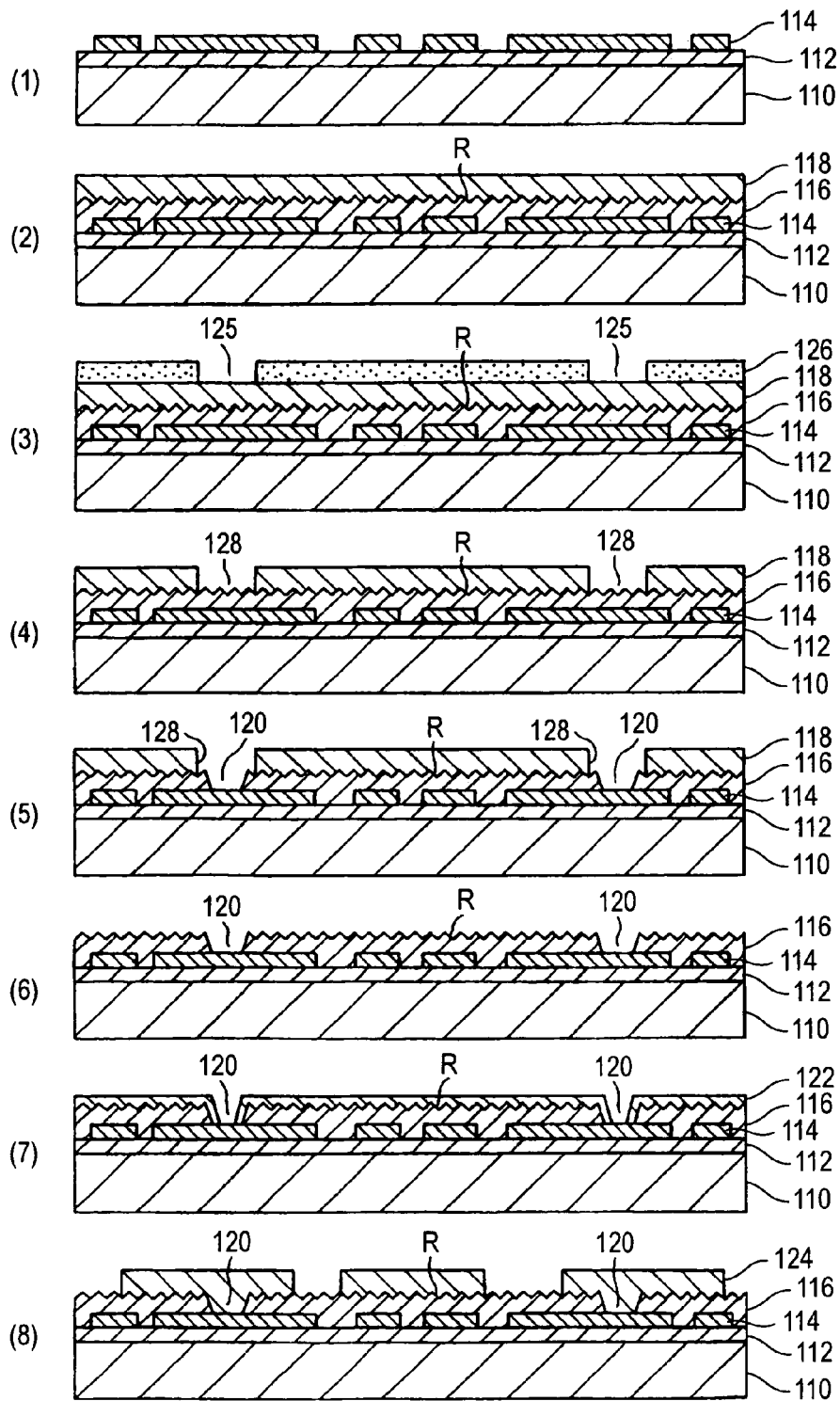
FIG. 2 is a cross-sectional view showing a process for forming wiring on an insulating resin layer according to an embodiment of the invention.

Referring to FIG. 2, a method for forming wiring on an insulating resin layer by an embodiment of the invention will be described.

As shown in FIG. 2-(1), an insulating resin substrate 110 is provided, a base-layer wiring layer 114 made up of a metallic foil being formed via an insulating resin layer 112 on the surface of the insulating resin substrate 110.

Next, as shown in FIG. 2-(2), a thermosetting resin film 116 in a semi-cured state and a metallic foil 118 are laid one over the other and pressed with heat (hot press) on the substrate 110. On that occasion, a mat surface (roughened surface) of the metallic foil 118 is overlaid on the surface of the semi-cured resin film 116. To the top surface of the resin film 116 in semi-cured state against which the mat surface of the metallic foil 118 is pressed is transferred the unevenness of the mat surface to form a roughened surface R. Thus, an integral structure is obtained where a substrate 110 including an insulating resin layer 112 and base-layer wiring 114, an insulating resin layer 116 made up of a thermally cured resin film, and a metallic foil 118 are laminated.

The thermosetting insulating resin film 116 may be any thermosetting insulating resin film used for the inter-layer insulating layer of a multi-layer printed wiring board and need not be particularly limited. Especially advantageous materials of the thermosetting insulating resin film 16 to obtain the advantages of the invention include: (1) an epoxy-based insulating resin (build-up resin); (2) a glass-epoxy resin (including a prepreg material impregnated with a glass cloth); and (3) engineering plastics (liquid crystal polymer (LCP), polyether ether ketone (PEEK)).

The metallic foil 118 may be any metallic material (as a release agent used in pressing, as well as a wiring material) generally used for a multi-layer printed wiring board, and need not be particularly limited. Representative metallic foils include a copper foil and a nickel foil. Such a metallic foil has one smooth surface, so-called the shine surface, and one mat surface roughened to enhance adhesion to a resin. The surface roughness of a representative copper foil is about Ra=0.15 to 0.25 micrometers for the shiny surface and about Ra=2.0 to 4.0 micrometers for the mat surface.

Conditions for heat pressing vary depending on the material used. Representative conditions include a vacuum laminate (110° C., 0.1 MPa, vacuum 40 sec, press 20 sec) plus flattening press (100 to 150° C., 0.3 to 1.0 MPa) for the cases (1) and (2) above, and laminating by pressing with pressure (150 to 230° C., 1.0 to 5.0 MPa) for the case (3) above.

As shown in FIG. 2-(3), a resist pattern 126 is formed on the metallic foil 118, the resist pattern 126 having an opening 125 in a position corresponding to the position of a via hole to be formed in the insulating resin layer 116 later.

As shown in FIG. 2-(4), etching is performed using the resist pattern 126 as a mask. The metallic foil 118 on a part of the resist pattern 126, being exposed at the opening 125 is removed to form the opening 128, and the resist pattern 126 is removed. The insulating resin layer 116 is exposed at the opening 128.

Next, as shown in FIG. 2-(5), high energy beams are irradiated to form a via hole 120 in the insulating resin layer 116 exposed inside the opening 128 of the metallic foil 118. The desmear process follows to remove smear in the via hole 120.

Next, as shown in FIG. 2-(6), the metallic foil 118 is removed by etching. This exposes the roughened surface R of the insulating resin layer 116. The roughened surface R is protected by the metallic foil 118 in the desmear process, so that the unevenness transferred from the mat surface of the metallic foil 118 remains unsmoothed.

In the description that follows, an electroless-plated layer is formed and an electroplated layer is formed thereon by the semi-additive process.

That is, as shown in FIG. 2-(7), an electroless-plated layer 122 as a continuous layer is formed on the entirety of the exposed surface above the substrate 110, the exposed surface including the top surface [roughened surface] R of the insulating resin layer 116, side surface of the via hole 120 and the top surface of the base-layer wiring layer 114 exposed at the bottom of the via hole 120.

Finally, as shown in FIG. 2-(8), the electroless-plated layer 122 is used as a power feeding layer to form wiring 124 made up of an electroplated layer by a semi-additive process. The electroless-plated layer 122 and the electroplated layer are typically an electroless-plated copper layer and an electroplated copper layer.

The semi-additive process is typically done in the processes (A) to (D):

(A) a process for forming a resist pattern on the electroless-plated layer 122, the resist pattern having an opening that defines a wiring pattern;

(B) a process for forming an electroplated layer 124 on the electroless-plated layer 122 being exposed at the opening of the resist pattern;
(C) removing the resist pattern so as to expose an electroless-plated layer in a part where an electroplated layer is not formed; and
(D) removing the exposed electroless-plated layer by flash etching so as to identify the wiring 124 made up of an electroplated layer.

The wiring 124 obtained through the processes (1) to (8) in FIG. 2 has a roughened surface R as an interface between itself and the insulating resin layer 116 as a ground layer. As a result, a large mechanical anchor effect is obtained thereby ensuring a high joining strength between the resin and the wiring.

EXAMPLE

A peel strength was tested on the wiring formed by the embodiment of the invention and comparison was made with the wiring formed by the related art method. The peeling test using a test piece according to "JIS Z2201", and a tensile test method according to "JIS Z2241" are performed.

[Test Sample]
A sample in the same state as FIG. 2-(8) was prepared. However, the via hole 120 was not formed. The wiring 124 had a rectangular shape of 5 to 10 mm in width instead of an actual wiring pattern. The film thickness was 15 to 25 micrometers.

[Test Method]
A tensile test instrument was used to pull the rectangular wiring 124 (including the electroless-plated seed layer 122) in a longitudinal direction of the sample. On that occasion, the wiring was moved at a speed of about 30 mm/min while being raised vertically, and a tensile strength value was measured every five seconds. The average of these measurements is assumed as the peel strength of the insulating resin layer 116.

[Test Result]
As a result of the test, a maximum of 7 N/cm was obtained as the peel strength for the test sample according to the embodiment of the invention, as improvement of peel strength with respect to a case where the surface of an insulating resin layer is not roughened. Currently required improvement of peel strength is equal to or more than 5N/cm. Thus, the method according to the invention substantially satisfies the requirement.

On the other hand, the related art method revealed the improvement of peel strength of a maximum 3 N/cm, which failed to satisfy the requirement.

According to the invention, a method is provided for forming wiring that ensures a sufficient joining strength of the wiring to an insulating resin layer as a ground layer.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:
1. A method for forming wiring on an insulating resin layer, the method comprising:
   laminating a thermosetting resin film in a semi-cured state and a metallic foil in this order on an insulating substrate on which base-layer wiring is formed, a mat surface of the metallic foil having a surface roughness and facing the thermosetting resin film, and pressing the thermosetting resin film and the metallic foil with application of heat so that the surface roughness of the metallic foil is substantially transferred to a surface of the thermosetting resin film facing the metallic foil to form an even roughened surface;
   forming a single-piece structure in which the insulating resin layer including the thermosetting resin film in a cured state and the metallic foil are laminated on the insulating substrate;
   forming openings in the metallic foil so as to expose parts of the insulating resin layer in which via holes are to be formed;
   forming via holes in the insulating resin layer by irradiating a laser beam onto the insulating resin layer by using the metallic foil in which the openings are formed as a mask;
   performing a desmear process of the via holes via the openings of the metallic foil before removing the metallic foil;
   removing the metallic foil by etching to expose the even roughened surface of the thermosetting resin film;
   forming an electroless-plated layer that continuously covers the even roughened surface, a side surface of the via holes and a top surface of the base-layer wiring corresponding to the bottom of the via holes; and
   forming wiring including an electroplated layer on the electroless-plated layer by a semi-additive process.
2. The method for forming wiring according to claim 1, wherein the semi-additive process includes;
   forming on the electroless-plated layer a resist pattern having an opening that defines a wiring pattern;
   forming the electroplated layer on the electroless-plated layer being exposed at the openings of the resist pattern;
   removing the resist pattern so as to expose a part of the electroless-plated layer in which the electroplated layer is not formed; and
   removing the exposed electroless-plated layer by flash etching so as to identify the wiring including the electroplated layer.

* * * * *